(12) United States Patent
Kwon

(10) Patent No.: US 11,152,337 B2
(45) Date of Patent: Oct. 19, 2021

(54) SEMICONDUCTOR PACKAGE

(71) Applicant: Samsung Electronics Co., Ltd., Suwon-si (KR)

(72) Inventor: Won Kyun Kwon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/876,561

(22) Filed: May 18, 2020

(65) Prior Publication Data

US 2021/0066253 A1 Mar. 4, 2021

(30) Foreign Application Priority Data

Aug. 28, 2019 (KR) .................. 10-2019-0105529

(51) Int. Cl.
*H01L 25/065* (2006.01)
*H01L 23/00* (2006.01)

(52) U.S. Cl.
CPC ........ *H01L 25/0657* (2013.01); *H01L 23/562* (2013.01); *H01L 2225/06513* (2013.01); *H01L 2225/06541* (2013.01); *H01L 2225/06555* (2013.01); *H01L 2225/06582* (2013.01)

(58) Field of Classification Search
CPC ............... H01L 25/0657; H01L 23/562; H01L 2225/06513; H01L 2225/06541; H01L 2225/06555; H01L 2225/06582

USPC ........................................................ 257/777
See application file for complete search history.

(56) References Cited

U.S. PATENT DOCUMENTS

| | | | |
|---|---|---|---|
| 7,936,060 | B2 | 5/2011 | Andry et al. |
| 8,076,762 | B2 | 12/2011 | Chandrasekaran et al. |
| 9,595,507 | B2 | 3/2017 | Kurita |
| 9,601,465 | B2 | 3/2017 | Kang et al. |
| 2015/0228591 | A1 | 8/2015 | Kim et al. |
| 2017/0047309 | A1 | 2/2017 | Baek et al. |

FOREIGN PATENT DOCUMENTS

| | | |
|---|---|---|
| JP | 2010-245383 A | 10/2010 |
| JP | 2014-154697 A | 8/2014 |
| KR | 10-1781799 B1 | 9/2017 |

*Primary Examiner* — Elias Ullah
(74) *Attorney, Agent, or Firm* — Harness, Dickey & Pierce, P.L.C.

(57) ABSTRACT

A semiconductor package including a first semiconductor chip having a first thickness, a second semiconductor chip on the first semiconductor chip and having a second thickness, the second thickness being smaller than the first thickness, a third semiconductor chip on the second semiconductor chip and having a third thickness, the third thickness being smaller than the second thickness, a fourth semiconductor chip on the third semiconductor chip and having a fourth thickness, the fourth thickness being greater than the third thickness, and a fifth semiconductor chip disposed on the fourth semiconductor chip and having a fifth thickness, the fifth thickness being greater than the fourth thickness may be provided.

20 Claims, 10 Drawing Sheets

SEMICONDUCTOR PACKAGE

CROSS-REFERENCE TO RELATED APPLICATION

This application claims priority to Korean Patent Application No. 10-2019-0105529, filed on Aug. 28, 2019, and all the benefits accruing therefrom under 35 U.S.C. § 119, the disclosure of which is incorporated herein by reference in its entirety.

BACKGROUND

1. Technical Field

The present disclosure relates to semiconductor packages, and more particularly, to a semiconductor packages including semiconductor chips having a through silicon via (TSV).

2. Description of the Related Art

With rapid developments in the electronics industry and a variety of user demands, electronic devices including semiconductor packages have become smaller and lighter. Semiconductor packages for use in electronic devices are desired to have not only a smaller size and a lighter weight, but also higher performance and larger capacity.

In order to realize high performance, research and development have been continued on how to stack multi-chips.

SUMMARY

Some example embodiments of the present disclosure provide semiconductor packages in which semiconductor chips have different chip thicknesses depending on the order of stacking the semiconductor chips, to improve warpage.

However, example embodiments of the present disclosure are not restricted to those set forth herein. The above and other example embodiments of the present disclosure will become more apparent to one of ordinary skill in the art to which the present disclosure pertains by referencing the detailed description of the example embodiments given below.

According to an example embodiment of the present disclosure, a semiconductor package includes a first semiconductor chip having a first thickness, a second semiconductor chip on the first semiconductor chip and having a second thickness, the second thickness being smaller than the first thickness, a third semiconductor chip on the second semiconductor chip and having a third thickness, the third thickness being smaller than the second thickness, a fourth semiconductor chip on the third semiconductor chip and having a fourth thickness, the fourth thickness being greater than the third thickness and a fifth semiconductor chip on the fourth semiconductor chip and having a fifth thickness, the fifth thickness being greater than the fourth thickness.

According to an example embodiment of the present disclosure, a semiconductor package includes a first semiconductor chip and a second semiconductor chip spaced apart from each other, a third semiconductor chip between the first and second semiconductor chips, the third semiconductor chip being directly on the first semiconductor chip, a fourth semiconductor chip between the first and second semiconductor chips, the fourth semiconductor chip being directly below the second semiconductor chip, the fourth semiconductor chip having the same thickness as the third semiconductor chip, a fifth semiconductor chip between the third and fourth semiconductor chips, the fifth semiconductor chip having a smaller thickness than the third semiconductor chip, and a package molding part on the first semiconductor chip, the package molding part including a first portion that surrounds side surfaces of the second through fifth semiconductor chips and exposes a top surface of the second semiconductor chip.

According to an example embodiment of the present disclosure, a semiconductor package includes, a first semiconductor chip having a first thickness and including first through vias, a second semiconductor chip directly on the first semiconductor chip, the second semiconductor chip having a second thickness and including second through vias, the second thickness being smaller than the first thickness, a third semiconductor chip on the second semiconductor chip, the third semiconductor chip having a third thickness and including third through vias, the third thickness being smaller than the second thickness, a fourth semiconductor chip on the third semiconductor chip, the fourth semiconductor chip having the second thickness and including fourth through vias, a fifth semiconductor chip directly on the fourth semiconductor chip, the fifth semiconductor chip having a fourth thickness and not including through vias, which is the fourth thickness being greater than the second thickness, and a package molding part on the first semiconductor chip and exposing a top surface of the fifth semiconductor chip.

DETAILED DESCRIPTION

In the present disclosure, the term "and/or" includes any and all combinations of one or more of the associated listed items. Expressions such as "at least one of," when preceding a list of elements, modify the entire list of elements and do not modify the individual elements of the list. Thus, for example, both "at least one of A, B, or C" and "A, B, and C" means either A, B, C or any combination thereof.

While the term "same" or "identical" is used in description of the example embodiments in this disclosure, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification or the claims in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure.

Figure 1A:
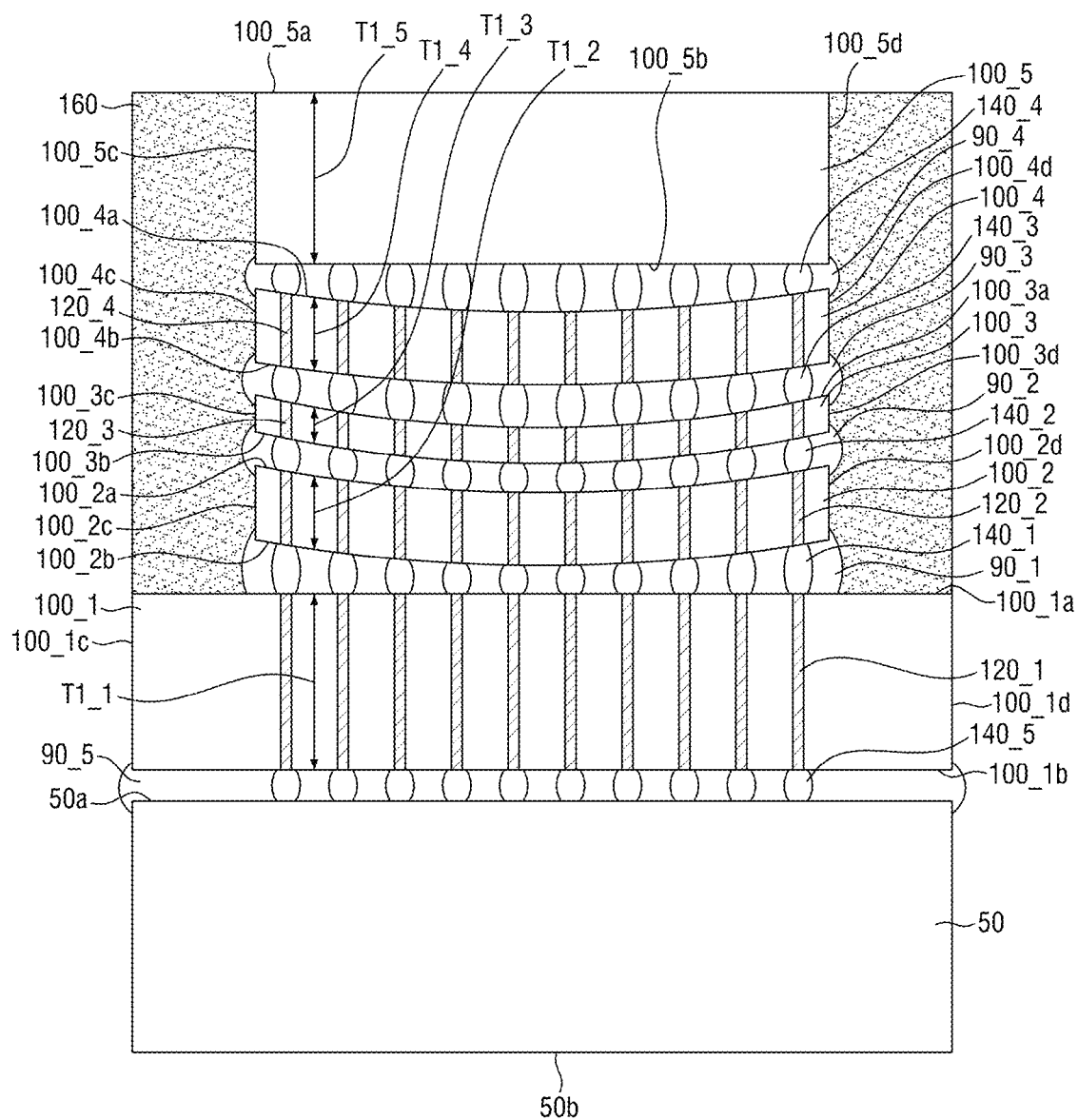
FIG. 1A is a cross-sectional view of a semiconductor package according to an example embodiment of the present disclosure.

FIG. 1A is a cross-sectional view of a semiconductor package according to an example embodiment of the present disclosure.

Referring to FIG. 1A, the semiconductor package may include a mounting substrate 50, first through fifth semiconductor chips 100_1 through 100_5, first connecting terminals 140_1, second connecting terminals 140_2, third connecting terminals 140_3, fourth connecting terminals 140_4, and fifth connecting terminals 140_5.

The mounting substrate 50 may be a substrate for packaging, for example, one of a printed circuit substrate (PCB), an interposer substrate, or a redistribution layer (RDL) substrate. Wires, pads, lands, and the like may be formed between a top surface 50a and a bottom surface 50b of the mounting substrate 50.

The first through fifth semiconductor chips 100_1 through 100_5 may be disposed on the mounting substrate 50. For example, the second semiconductor chip 100_2 may be disposed between the first and third semiconductor chips 100_1 and 100_3, the third semiconductor chip 100_3 may be disposed between the second and fourth semiconductor chips 100_2 and 100_4, and the fourth semiconductor chip 100_4 may be disposed between the third and fifth semiconductor chips 100_3 and 100_5.

Accordingly, the mounting substrate 50 may be disposed below the first semiconductor chip 100_1, and the first semiconductor chip 100_1 may be disposed between the mounting substrate 50 and the second semiconductor chip 100_2.

For example, the second semiconductor chip 100_2 may be disposed directly on the first semiconductor chip 100_1, and the fourth semiconductor chip 100_4 may be disposed directly below the fifth semiconductor chip 100_5. Here, the expression "one element being disposed directly on another element", as used herein, means that there exists no intervening semiconductor chip between the two elements, and the expression "one element being disposed directly below another element", as used herein, also means that there exists no intervening semiconductor chip between the two elements. Accordingly, there exists no semiconductor chip between the first and second semiconductor chips 100_1 and 100_2, and there also exists no semiconductor chip between the fourth and fifth semiconductor chips 100_4 and 100_5.

For example, the first through fifth semiconductor chips 100_1 through 100_5 may be semiconductor memory chips. For example, the semiconductor memory chips may be volatile semiconductor memory chips (e.g., dynamic random access memories (DRAMs) or static random access memories (SRAMs)) or nonvolatile semiconductor memory chips (e.g., phase-change random access memories (PRAMs), magnetoresistive random access memories (MRAMs), ferroelectric random access memories (FeRAMs), or resistive random access memories (RRAMs)).

In another example, the first semiconductor chip 100_1 may be a logic semiconductor chip, and the second semiconductor chip 100_2 may be a semiconductor memory chip. The first semiconductor chip 100_1 may be a controller semiconductor chip electrically connected to the second semiconductor chip 100_2 to control the input of data to or the output of data from the second semiconductor chip 100_2.

The first semiconductor chip 100_1 may have a first thickness $T1\_1$, the second semiconductor chip 100_2 may have a second thickness $T1\_2$, which is smaller than the first thickness $T1\_1$, the third semiconductor chip 100_3 may have a third thickness, which is smaller than the second thickness $T1\_2$, the fourth semiconductor chip 100_4 may have a fourth thickness $T1\_4$, which is greater than the third thickness $T1\_3$, and the fifth semiconductor chip 100_5 may have a fifth thickness $T1\_5$, which is greater than the fourth thickness $T1\_4$.

The second through fourth semiconductor chips 100_2 through 100_4 may protrude slightly in a downward direction. In other words, the second through fourth semiconductor chips 100_2 through 100_4 may have a concave shape. Thus, a clear definition of the term "thickness" is needed here.

The first thickness $T1\_1$ refers to the height from a bottom surface 100_1b to a top surface 100_1a of the first semiconductor chip 100_1.

The second thickness $T1\_2$ refers to the height from a bottom surface 100_2b to a top surface 100_2a of the second semiconductor chip 100_2.

The third thickness $T1\_3$ refers to the height from a bottom surface 100_3b to a top surface 100_3a of the third semiconductor chip 100_3.

The fourth thickness $T1\_4$ refers to the height from a bottom surface 100_4b to a top surface 100_4a of the fourth semiconductor chip 100_4.

The fifth thickness $T1\_5$ refers to the height from a bottom surface 100_5b to a top surface 100_5a of the fifth semiconductor chip 100_5.

In a chip-on-wafer (COW) process, the second through fourth semiconductor chips 100_2 through 100_4, which are relatively thin, may be stacked on the first semiconductor chip 100_1, to which a wafer supporting system (WSS) (not illustrated) is applied, and the fifth semiconductor chip 100_5, which is relatively thick, may be stacked on the fourth semiconductor chip 100_4.

In some example embodiments, the first and fifth thicknesses $T1\_1$ and $T1\_5$ may be the same or may be different. In other example embodiments, each of the first and fifth thicknesses $T1\_1$ and $T1\_5$ may be greater than each of the second through fourth thicknesses $T1\_2$ through $T1\_4$.

In some example embodiments, the second and fourth thicknesses $T1\_2$ and $T1\_4$ may be the same or may be different. In other example embodiments, each of the second and fourth thicknesses $T1\_2$ and $T1\_4$ may be greater than the third thickness $T1\_3$.

For convenience, it is assumed that the second through fourth thicknesses $T1\_2$ through $T1\_4$ are the same before a process of adjusting the thicknesses of semiconductor chips.

In some example embodiments, the third thickness $T1\_3$ may be reduced by as much as the amount by which the second and fourth thicknesses $T1\_2$ and $T1\_4$ are increased.

The amount by which the second thickness T1_2 is increased may be the same as, or different from, the amount by which the fourth thickness T1_4 is increased. Even in this case, the sum of the first through fifth thicknesses T1_1 through T1_5 desired to be kept constant regardless of whether the amount by which the second thickness T1_2 is increased is the same as, or different from, the amount by which the fourth thickness T1_4 is increased.

In some example embodiments, in a case where the fifth thickness T1_5 is smaller than the first thickness T1_1, the fourth thickness T1_4 may become greater than the second thickness T1_2 because the fourth thickness T1_4 may be increased by the amount by which the fifth thickness T1_5 is reduced as compared to the first thickness T1_1.

In other example embodiments, in a case where the fifth thickness T1_5 is the same as the first thickness T1_1, the fourth thickness T1_4 may be the same as the second thickness T1_2 because the second and fourth thicknesses T1_2 and T1_4 may be increased by the amount by which the fifth thickness T1_5 is reduced as compared to the first thickness T1_1. Accordingly, the second and fourth thicknesses T1_2 and T1_4 may be the same or may be different.

If the second through fourth thicknesses T1_2 through T1_4 are the same, warpage may be caused between the first and second semiconductor chips 100_1 and 100_2. For example, warpage may occur on the edges of the space between the first and second semiconductor chips 100_1 and 100_2, causing connection defects between the first and second semiconductor chips 100_1 and 100_2.

Warpage may also occur between the fourth and fifth semiconductor chips 100_4 and 100_5. For example, warpage may occur in the center of the space between the fourth and fifth semiconductor chips 100_4 and 100_5, causing connection defects between the fourth and fifth semiconductor chips 100_4 and 100_5.

For example, there may be an warpage between edges of the thin wafer (e.g. the second semiconductor chip 100_2) which protrude slightly in a downward direction and edges of the thick wafer (e.g. the first semiconductor chip 100_1) which has a flat shape so as to cause connection defects between the thin wafer and the thick wafer. For example, there may be an warpage between a center of the thin wafer (e.g. the fourth semiconductor chip 100_4) which protrude slightly in a downward direction and a center of the thick wafer (e.g. the fifth semiconductor chip 100_5) which has a flat shape so as to cause connection defects between the thin wafer and the thick wafer.

As a method to improve warpage, a four-level stacking process will hereinafter be described. In a process of adjusting the thicknesses of semiconductor chips before stacking, the second and fourth thicknesses T1_2 and T1_4, which are the same, may be increased by 4 µm, and the third thickness T1_3 may be reduced by 8 µm.

Thus, by making the second and fourth thicknesses T1_2 and T1_4 greater than the third thickness T1_3, connection defects between the first and second semiconductor chips 100_1 and 100_2, between the fourth and fifth semiconductor chips 100_4 and 100_5, and between the mounting substrate 50 and the first through fifth semiconductor chips 100_1 through 100_5 that may be caused by warpage in areas where the first and second semiconductor chips 100_1 and 100_2 are coupled and where the fourth and fifth semiconductor chips 100_4 and 100_5 are coupled can be improved.

The second and fourth thicknesses T1_2 and T1_4 may be different. That is, in the four-level stacking process, the second through fourth semiconductor chips 100_2 through 100_4 may be stacked by increasing the second and fourth thicknesses T1_2 and T1_4 by 3.9 µm and 4.1 µm, respectively, and reducing the third thickness T1_3 by 8 µm.

The first semiconductor chip 100_1 may include a plurality of first through vias 120_1, the second semiconductor chip 100_2 may include a plurality of second through vias 120_2, the third semiconductor chip 100_3 may include a plurality of third through vias 120_3, and the fourth semiconductor chip 100_4 may include a plurality of fourth through vias 120_4. The first through vias 120_1, the second through vias 120_2, the third through vias 120_3, and the fourth through vias 120_4 may include at least one metal.

For example, the first through vias 120_1, the second through vias 120_2, the third through vias 120_3, and the fourth through vias 120_4 may include barrier metal layers (not illustrated) and wire metal layers (not illustrated). The barrier metal layers may include at least one metal selected from among W, WN, WC, Ti, TiN, Ta, TaN, Ru, Co, Mn, WN, Ni, and NiB and may be formed as single- or multi-layer films. The wire metal layers may include Cu or W. For example, the wire metal layers may be formed of Cu, CuSn, CuMg, CuNi, CuZn, CuPd, CuAu, CuRe, CuW, W, and a W alloy, but the present disclosure is not limited thereto. For example, the wire metal layers may include at least one of Al, Au, Be, Bi, Co, Cu, Hf, In, Mn, Mo, Ni, Pb, Pd, Pt, Rh, Re, Ru, Ta, Te, Ti, W, Zn, and Zr, and may include one or two stack structures. The material of the first through vias 120_1, the second through vias 120_2, the third through vias 120_3, and the fourth through vias 120_4 is not particularly limited. The barrier metal layers and the wire metal layers may be formed by physical vapor deposition (PVD) or chemical vapor deposition (CVD), but the present disclosure is not limited thereto.

The fifth semiconductor chip 100_5, unlike the first through fourth semiconductor chips 100_1 through 100_4, may not include through vias.

The semiconductor package according to some example embodiments of the present disclosure may include the first connecting terminals 140_1, the second connecting terminals 140_2, the third connecting terminals 140_3, the fourth connecting terminals 140_4, and the fifth connecting terminals 140_5, which are for electrically connecting the first through fifth semiconductor chips 100_1 through 100_5 to one another and for electrically connecting the first through fifth semiconductor chips 100_1 through 100_5 and the mounting substrate 50.

The first connecting terminals 140_1 may be disposed between the first and second semiconductor chips 100_1 and 100_2.

The second connecting terminals 140_2 may be disposed between the second and third semiconductor chips 100_2 and 100_3.

The third connecting terminals 140_3 may be disposed between the third and fourth semiconductor chips 100_3 and 100_4.

The fourth connecting terminals 140_4 may be disposed between the fourth and fifth semiconductor chips 100_4 and 100_5.

The fifth connecting terminals 140_5 may be disposed between the mounting substrate 50 and the first semiconductor chip 100_1.

The first connecting terminals 140_1, the second connecting terminals 140_2, the third connecting terminals 140_3, the fourth connecting terminals 140_4, and the fifth connecting terminals 140_5 are illustrated as being balls, but the present disclosure is not limited thereto. The first connecting terminals 140_1, the second connecting terminals 140_2, the third connecting terminals 140_3, the fourth connecting terminals 140_4, and the fifth connecting terminals 140_5 may be solder bumps, which are the combination of pillars and solder balls.

The pillars may be cylinders and may include, for example, Ni, Cu, Pd, Pt, Au, or a combination thereof. A diffusion barrier layer and/or an adhesive layer may be formed between the pillars and a solder layer. The diffusion barrier layer may include, for example, Ni, Co, Cu, or a combination thereof. The adhesive layer may include, for example, Ni, Cu, Pd, Co, Pt, Au, or a combination thereof.

The semiconductor package according to some example embodiments of the present disclosure may include first through fourth gap filling parts 90_1 through 90_4.

The first gap filling part 90_1 may fill the gap between the first and second semiconductor chips 100_1 and 100_2. The first gap filling part 90_1 is illustrated as covering parts of first and second side surfaces 100_2c and 100_2d of the second semiconductor chip 100_2, but the present disclosure is not limited thereto.

The second gap filling part 90_2 may fill the gap between the second and third semiconductor chips 100_2 and 100_3. The second gap filling part 90_2 is illustrated as covering parts of the first and second side surfaces 100_2c and 100_2d of the second semiconductor chip 100_2 and parts of first and second side surfaces 100_3c and 100_3d of the third semiconductor chip 100_3, but the present disclosure is not limited thereto.

The third gap filling part 90_3 may fill the gap between the third and fourth semiconductor chips 100_3 and 100_4. The third gap filling part 90_3 is illustrated as covering parts of the first and second side surfaces 100_3c and 100_3d of the third semiconductor chip 100_3 and parts of first and second side surfaces 100_4c and 100_4d of the fourth semiconductor chip 100_4, but the present disclosure is not limited thereto.

The fourth gap filling part 90_4 may fill the gap between the fourth and fifth semiconductor chips 100_4 and 100_5. The fourth gap filling part 90_4 is illustrated as covering parts of the first and second side surfaces 100_4c and 100_4d of the fourth semiconductor chip 100_4 and of first and second side surfaces 100_5c and 100_5d of the fifth semiconductor chip 100_5, but the present disclosure is not limited thereto.

The fifth gap filling part 90_5 may fill the gap between the mounting substrate 50 and the first semiconductor chip 100_1. The fifth gap filling part 90_5 is illustrated as covering parts of the first and second side surfaces 100_1c and 100_1d of the first semiconductor chip 100_1, but the present disclosure is not limited thereto.

The first through fifth gap filling parts 90_1 through 90_5 may be formed as non-conductive adhesives or non-conductive tapes having a fluxing effect. Here, the term "fluxing effect", as used herein, may refer to a phenomenon (as in a typical resin-based flux) in which a coating film, formed to cover the metallic surface of a soldered body to block the atmosphere, recovers metal oxides at the metallic surface of the soldered body during soldering, and at the same time is pushed away by molten solder so that the molten solder is in contact with the metallic surface of the soldered body, and that the remaining coating film serves as an insulator between circuit elements.

The first through fifth gap filling parts 90_1 through 90_5 may include one of silicon oxide, silicon nitride, silicon oxynitride, tetraethyl orthosilicate (TEOS), flowable oxide (FOX), tonen silazen (TOSZ), undoped silica glass (USG), borosilicate glass (BSG), phophosilica glass (PSG), borophosphosilicate glass (BPSG), and a low-k material. Examples of the low-k material include fluoride silicate glass (FSG), carbon-doped silicon oxide (CDO), xerogel, aerogel, amorphous fluorinated carbon, organo silicate glass, parylene, bis-benzocyclobutene (BCB), SILK, polyimide, and a porous polymeric material, but the present disclosure is not limited thereto.

A package molding part 160 may be disposed on the top surface 100_1a of the first semiconductor chip 100_1 and may surround the second through fourth semiconductor chips 100_2 through 100_4 and the first through fourth gap filling parts 90_1 through 90_4.

The package molding part 160 may hold the first through fifth semiconductor chips 100_1 through 100_5 included the semiconductor package together, and protect the second through fifth semiconductor chips 100_2 through 100_5 from external physical shock or moisture. The package molding part 160 may be formed by a molding process using one selected from among, for example, an epoxy molding compound (EMC), a silicone resin, polyimide, and an equivalent thereof. For example, the package molding part 160 may be formed of an epoxy-based material, a thermosetting material, a thermoplastic material, or a UV curable material. Examples of the thermosetting material may include a phenol-type curing agent, an acid anhydride-type curing agent, an amine-type curing agent, and an acrylic polymer additive.

The package molding part 160 may be formed of a resin, and may include filler. For example, the package molding part 160 may be formed of an epoxy-based material containing about 80% of silica filler. The content of the silica filler is not particularly limited. For example, the modulus of the package molding part 160 can be appropriately adjusted by appropriately adjusting the content of the silica filler. Here, the term "modulus", as used herein, refers to the modulus of elasticity. A material with a small modulus is relatively flexible or soft, and a material with a large modulus is relatively rigid or hard.

The package molding part 160 may surround the first and second side surfaces 100_5c and 100_5d of the fifth semiconductor chip 100_5 and may expose the top surface 100_5a of the fifth semiconductor chip 100_5.

In some example embodiments, the package molding part 160 may not cover the first and second side surfaces 100_1c and 100_1d of the first semiconductor chip 100_1.

Figure 1B:
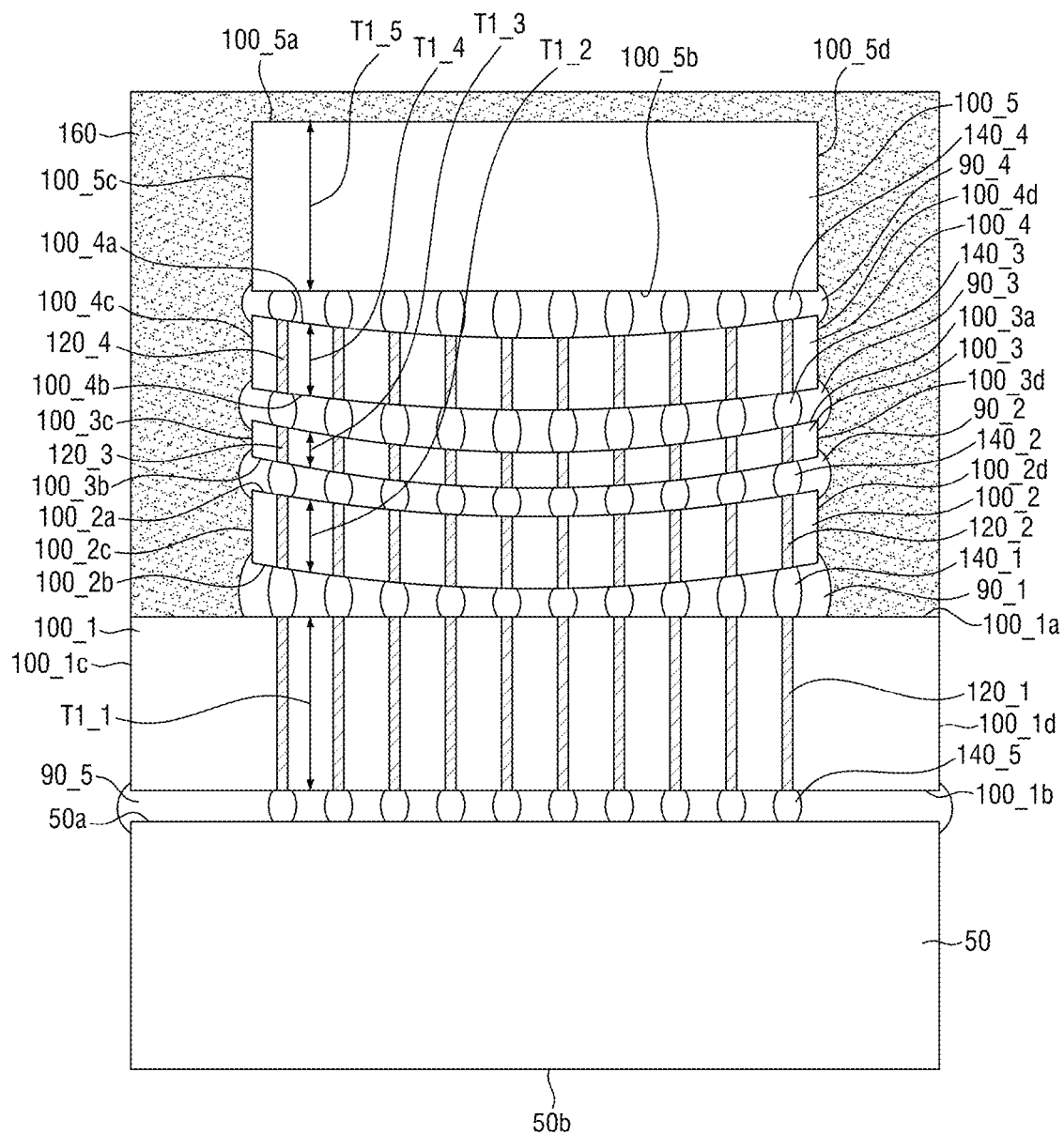
FIG. 1B is a cross-sectional view of a semiconductor package according to an example embodiment of the present disclosure.

FIG. 1B is a cross-sectional view of a semiconductor package according to an example embodiment of the present disclosure.

The semiconductor package of FIG. 1B will hereinafter be described, focusing mainly on the differences from the semiconductor package of FIG. 1B.

Referring to FIG. 1Ba package molding part 160 may cover not only the first and second side surfaces 100_5c and 100_5d of a fifth semiconductor chip 100_5, but also a top surface 100_5a of the fifth semiconductor chip 100_5. Because the package molding part 160 covers the top surface 100_5a of the fifth semiconductor chip 100_5, the package molding part 160 can protect the fifth semiconductor chip 100_5 from external physical shock or moisture applied to the top surface 100_5a of the fifth semiconductor chip 100_5.

Figure 2A:
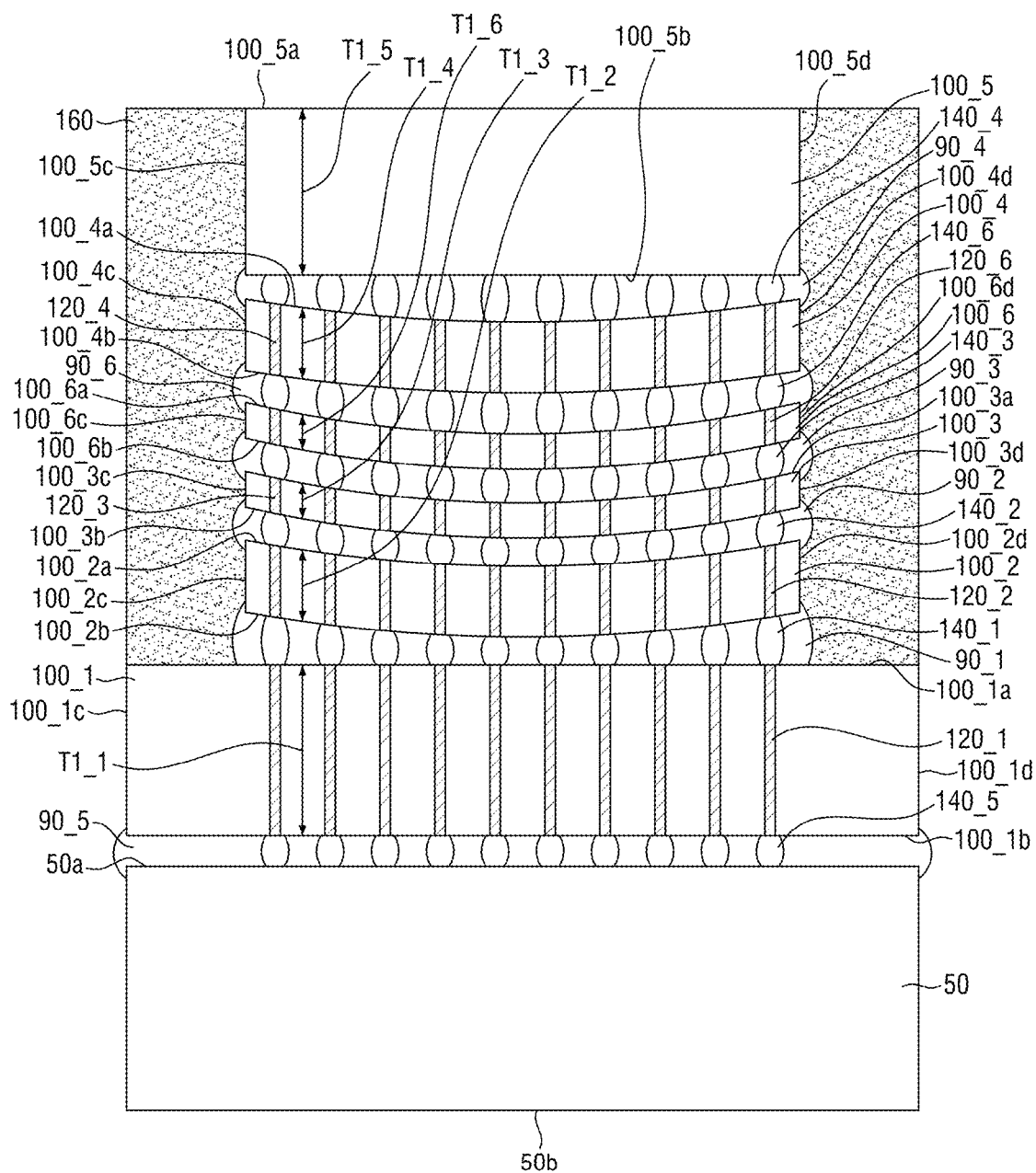
FIG. 2A is a cross-sectional view of a semiconductor package according to an example embodiment of the present disclosure.

FIG. 2A is a cross-sectional view of a semiconductor package according to an example embodiment of the present disclosure.

The semiconductor package of FIG. 2A will hereinafter be described, focusing mainly on the differences from the semiconductor package of FIG. 1A.

Referring to FIG. 2A, a sixth semiconductor chip 100_6 having a sixth thickness T1_6 may be disposed between third and fourth semiconductor chips 100_3 and 100_4.

The sixth thickness T1_6 may refer to the height from a bottom surface 100_6b to a top surface 100_6a of the sixth semiconductor chip 100_6.

In some example embodiments, second and fourth thicknesses T1_2 and T1_4 may be the same or may be different. In other example embodiments, each of the second and fourth thicknesses T1_2 and T1_4 may be greater than each of the third and sixth thicknesses T1_3 and T1_6.

In some example embodiments, the third and sixth thicknesses T1_3 and T1_6 may be the same or may be different.

For convenience, it is assumed that the second, third, fourth, and sixth thicknesses T1_2, T1_3, T1_4, and T1_6 are all the same before a process of adjusting the thicknesses of semiconductor chips.

A five-level stacking process by which the sixth semiconductor chip 100_6 is added can further improve warpage, as compared to the four-level stacking process of FIG. 1A. In the four-level stacking process of FIG. 1A, if each of the second and fourth thicknesses T1_2 and T1_4 are increased by 4 μm, the thickness of the third semiconductor chip 100_3 may be reduced by 8 μm.

In the five-level stacking process of FIG. 2A, if each of the second and fourth thicknesses T1_2 and T1_4 are increased by 4 μm, each of the thicknesses of the third and sixth semiconductor chips 100_3 and 100_6 may be reduced by 4 μm, thereby further improving warpage.

For example, because the sixth semiconductor chip 100_6 with the sixth thickness T1_6 is added, the second and fourth thicknesses T1_2 and T1_4 can be increased further than in the four-level stacking process of FIG. 1A. As a result, warpage can be mitigated or prevented on the edges of the space between first and second semiconductor chips 100_1 and 100_2, and any connection defects between the first and second semiconductor chips 100_1 and 100_2 can be improved.

Because the sixth semiconductor chip 100_6 with the sixth thickness T1_6 is added, the second and fourth thicknesses T1_2 and T1_4 can be increased further than in the four-level stacking process of FIG. 1A. Thus, warpage can be mitigated or prevented in the center of the space between the fourth and fifth semiconductor chips 100_4 and 100_5, and any connection defects between the fourth and fifth semiconductor chips 100_4 and 100_5 can be improved.

In some example embodiments, a sixth gap filling part 90_6 may fill the gap between the fourth and sixth semiconductor chips 100_4 and 100_6. The sixth gap filling part 90_6 is illustrated as covering parts of the first and second side surfaces 100_4c and 100_4d of the fourth semiconductor chip 100_4 and parts of first and second side surfaces 100_6c and 100_6d of the sixth semiconductor chip 100_6, but the present disclosure is not limited thereto.

The sixth semiconductor chip 100_6 may include a plurality of sixth through vias 120_6. The sixth through vias 120_6 may have the same structure as first through vias 120_1, second through vias 120_2, third through vias 120_3, fourth through vias 120_4, and fifth through vias 120_5.

Sixth connecting terminals 140_6 may be disposed on a top surface 100_6a of the sixth semiconductor chip 100_6 that is opposite to a bottom surface 100_6b of the sixth semiconductor chip 100_6. The sixth connecting terminals 140_6 may electrically connect the fourth and sixth semiconductor chips 100_4 and 100_6.

Figure 2B:
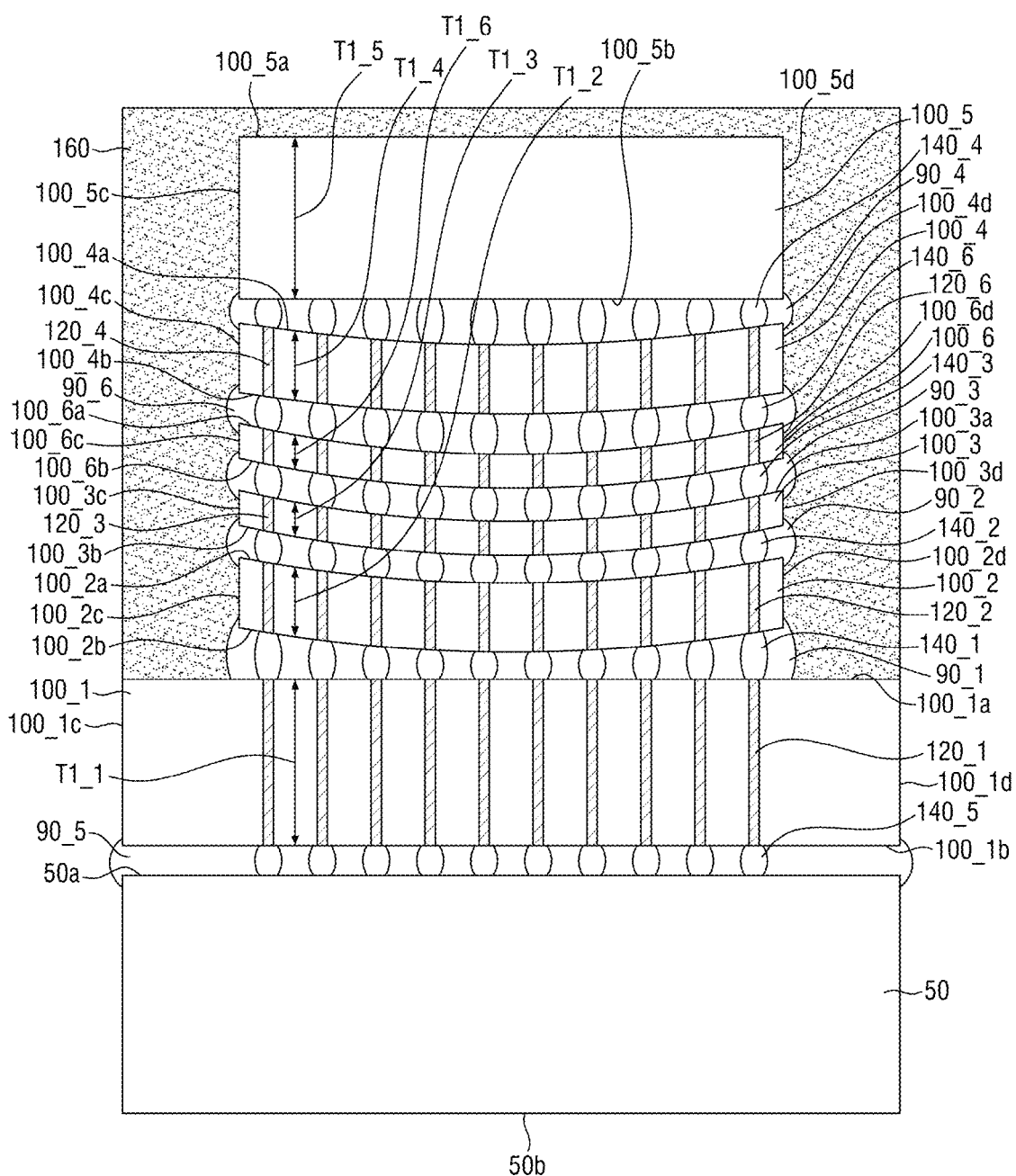
FIG. 2B is a cross-sectional view of a semiconductor package according to an example embodiment of the present disclosure.

FIG. 2B is a cross-sectional view of a semiconductor package according to an example embodiment of the present disclosure.

The semiconductor package of FIG. 2B will hereinafter be described, focusing mainly on the differences from the semiconductor package of FIG. 2A.

Referring to FIG. 2B, a package molding part 160 may cover not only the first and second side surfaces 100_5c and 100_5d of a fifth semiconductor chip 100_5, but also a top surface 100_5a of the fifth semiconductor chip 100_5. Because the package molding part 160 covers the top surface 100_5a of the fifth semiconductor chip 100_5, the package molding part 160 can protect the fifth semiconductor chip 100_5 from external physical shock or moisture applied to the top surface 100_5a of the fifth semiconductor chip 100_5.

Figure 3A:
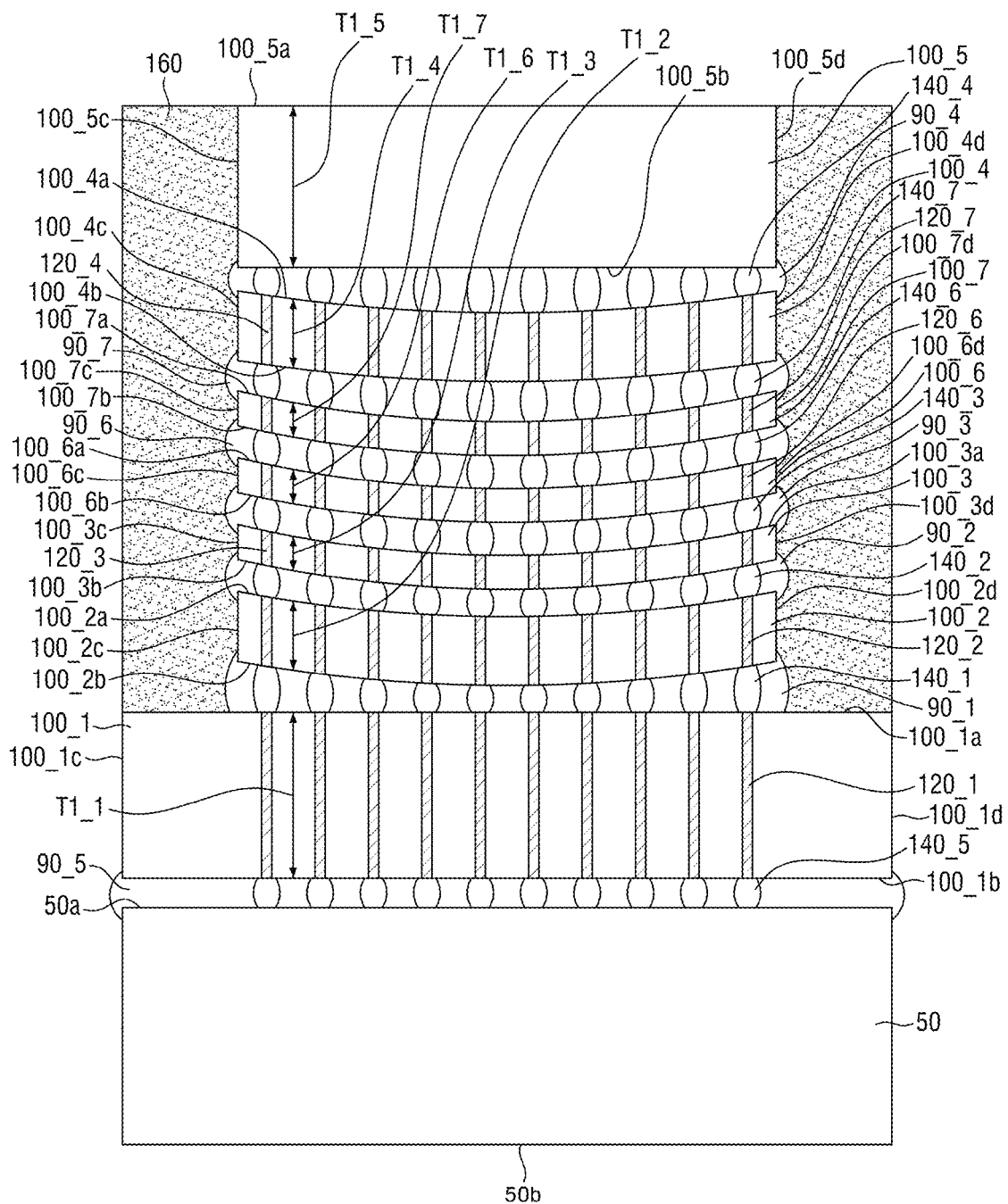
FIG. 3A is a cross-sectional view of a semiconductor package according to an example embodiment of the present disclosure.

FIG. 3A is a cross-sectional view of a semiconductor package according to an example embodiment of the present disclosure.

The semiconductor package of FIG. 3A will hereinafter be described, focusing mainly on the differences from the semiconductor package of FIG. 2A.

Referring to FIG. 3A, a seventh semiconductor chip 100_7 having a seventh thickness T1_7 may be disposed between fourth and sixth semiconductor chips 100_4 and 100_6.

The seventh thickness T1_7 may refer to the height from a bottom surface 100_7b to a top surface 100_7a of the seventh semiconductor chip 100_7.

In some example embodiments, the third and sixth thicknesses T1_3 and T1_6 and the seventh thickness T1_7 may be the same or may be different. In other example embodiments, each of the second and fourth thicknesses T1_2 and T1_4 may be greater than each of the third, sixth, and seventh thicknesses T1_3, T1_6, and T1_7.

For convenience, it is assumed that the second, third, fourth, sixth, and seventh thicknesses T1_2, T1_3, T1_4, T1_6, and T1_7 are all the same before a process of adjusting the thicknesses of semiconductor chips.

A six-level stacking process by which the seventh semiconductor chip 100_7 is added can further improve warpage, as compared to the five-level stacking process of FIG. 2A. In the five-level stacking process of FIG. 2A, if the second and fourth thicknesses T1_2 and T1_4 are increased by 4 μm, the thicknesses of the third and sixth semiconductor chips 100_3 and 100_6 need to be reduced by 4 μm.

In the six-level stacking process of FIG. 3A, if the second and fourth thicknesses T1_2 and T1_4 are increased by 4 μm, the thicknesses of the third, sixth, and seventh semiconductor chips 100_3, 100_6, and 100_7 are reduced by 8/3 μm, thereby further improving warpage.

For example, because the seventh semiconductor chip 100_7 with the seventh thickness T1_7 is added, the second and fourth thicknesses T1_2 and T1_4 can be increased further than in the five-level stacking process of FIG. 2A. Thus, warpage can be mitigated or prevented on the edges of the space between the first and second semiconductor chips 100_1 and 100_2, and any connection defects between the first and second semiconductor chips 100_1 and 100_2 can be improved.

Because the seventh semiconductor chip 100_7 with the seventh thickness T1_7 is added, the second and fourth thicknesses T1_2 and T1_4 can be increased further than in the five-level stacking process of FIG. 2A. Thus, warpage can be mitigated or prevented in the center of the space between the fourth and fifth semiconductor chips 100_4 and 100_5, and any connection defects between the fourth and fifth semiconductor chips 100_4 and 100_5 can be improved.

In some example embodiments, a seventh gap filling part 90_7 may fill the gap between the fourth and seventh semiconductor chips 100_4 and 100_7. The seventh gap filling part 90_7 is illustrated as covering parts of the first and second side surfaces 100_4c and 100_4d of the fourth semiconductor chip 100_4 and parts of first and second side surfaces 100_7c and 100_7d of the seventh semiconductor chip 100_7, but the present disclosure is not limited thereto.

The seventh semiconductor chip 100_7 may include a plurality of seventh through vias 120_7. The seventh through vias 120_7 may have the same structure as first through vias 120_1, second through vias 120_2, third through vias 120_3, fourth through vias 120_4, fifth through vias 120_5, and sixth through vias 120_6.

Seventh connecting terminals 140_7 may be disposed on a top surface 100_7a of the seventh semiconductor chip 100_7 that is opposite to a bottom surface 100_7b of the seventh semiconductor chip 100_7. The seventh connecting terminals 140_7 may electrically connect the fourth and seventh semiconductor chips 100_4 and 100_7 with each other.

Figure 3B:
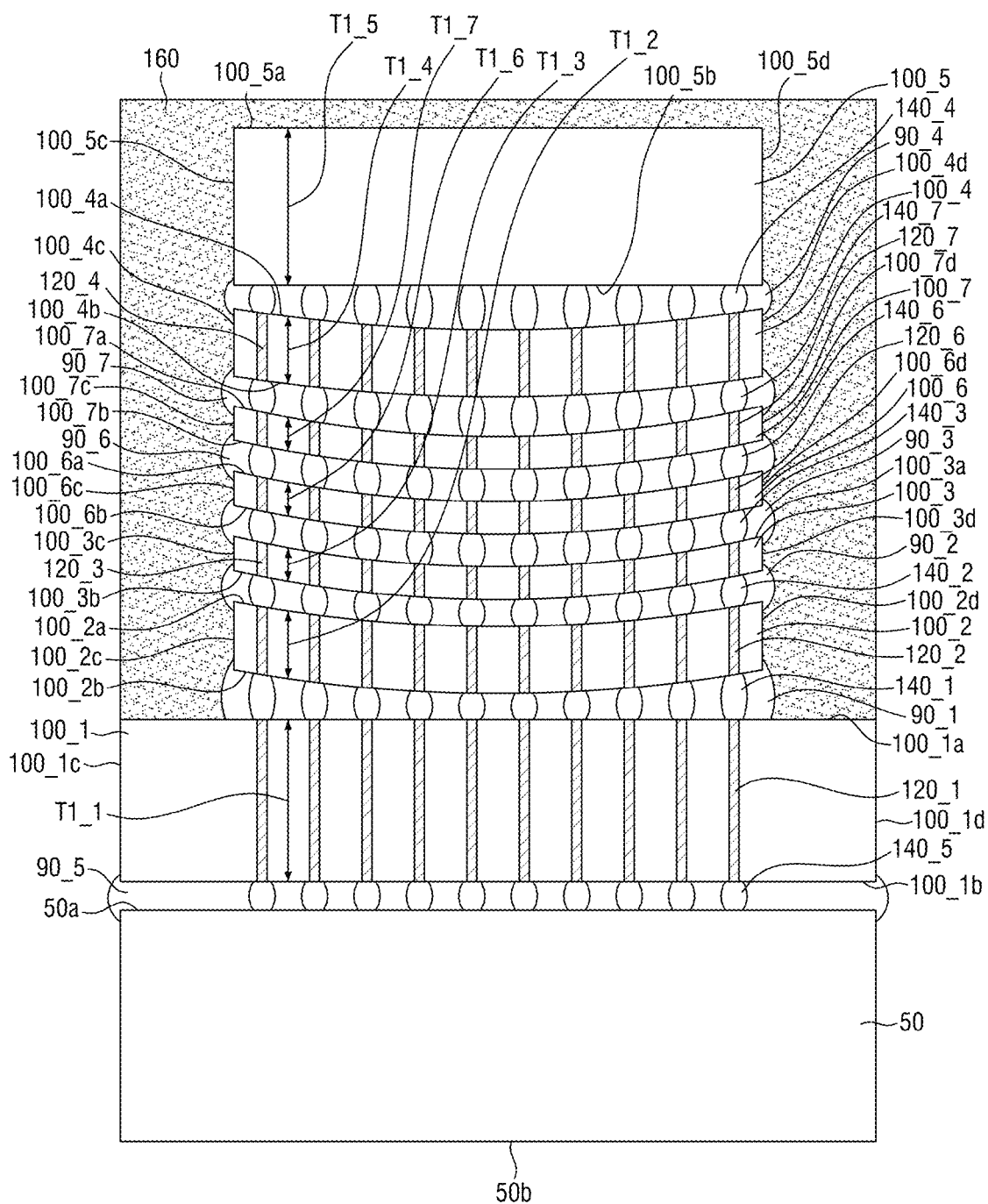
FIG. 3B is a cross-sectional view of a semiconductor package according to an example embodiment of the present disclosure.

FIG. 3B is a cross-sectional view of a semiconductor package according to an example embodiment of the present disclosure.

The semiconductor package of FIG. 3B will hereinafter be described, focusing mainly on the differences from the semiconductor package of FIG. 3A.

Referring to FIG. 3B, a package molding part 160 may cover not only the first and second side surfaces 100_5c and 100_5d of a fifth semiconductor chip 100_5, but also a top surface 100_5a of the fifth semiconductor chip 100_5. Because the package molding part 160 covers the top surface 100_5a of the fifth semiconductor chip 100_5, the package molding part 160 can protect the fifth semiconductor chip 100_5 from external physical shock or moisture applied to the top surface 100_5a of the fifth semiconductor chip 100_5.

Figure 4A:
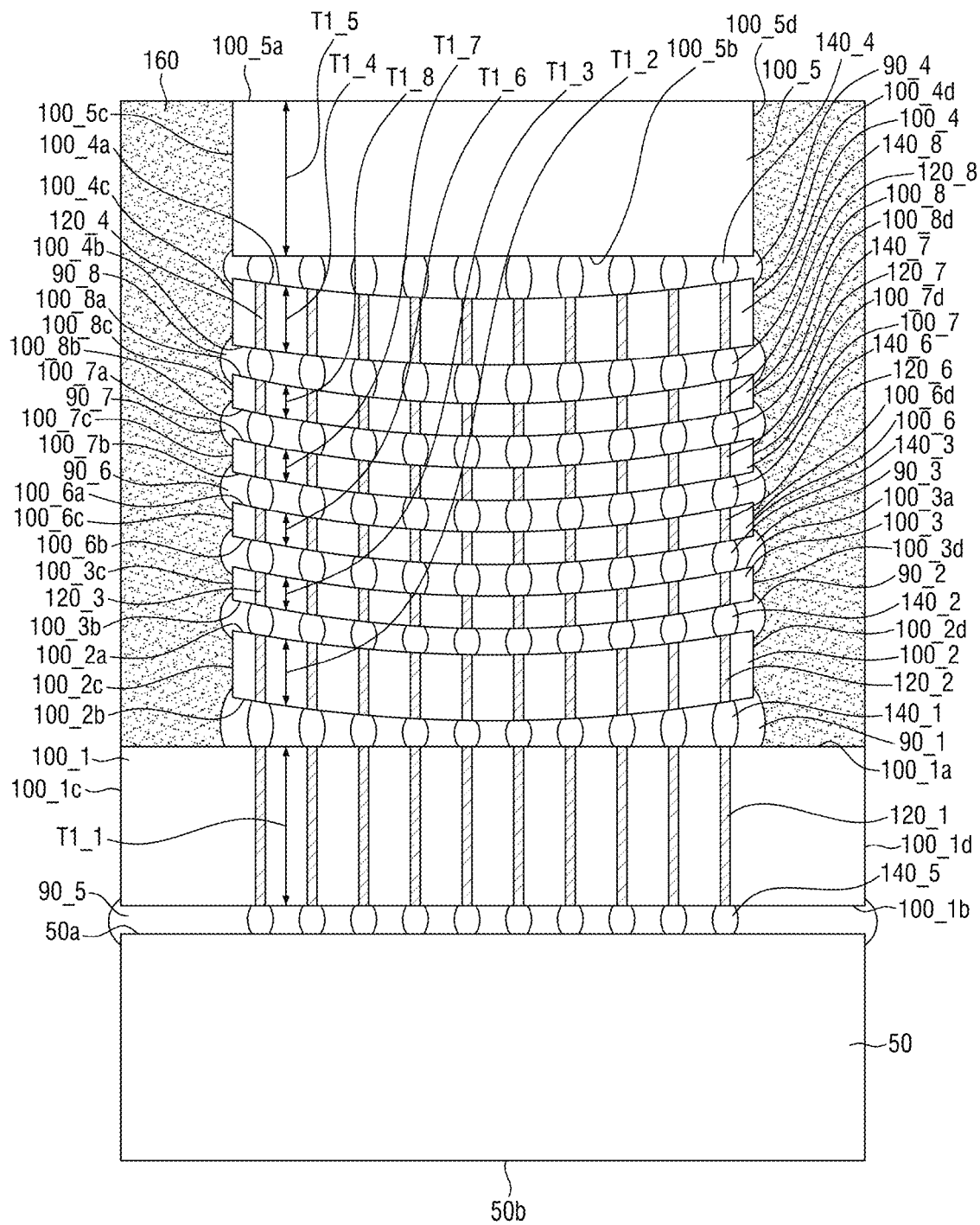
FIG. 4A is a cross-sectional view of a semiconductor package according to an example embodiment of the present disclosure.

FIG. 4A is a cross-sectional view of a semiconductor package according to an example embodiment of the present disclosure.

The semiconductor package of FIG. 4A will hereinafter be described, focusing mainly on the differences from the semiconductor package of FIG. 3A.

Referring to FIG. 4A, an eighth semiconductor chip 100_8 having an eighth thickness $T1\_8$ may be disposed between fourth and seventh semiconductor chips 100_4 and 100_7.

The eighth thickness $T1\_8$ may refer to the height from a bottom surface 100_8b to a top surface 100_8a of the eighth semiconductor chip 100_8.

In some example embodiments, the third, sixth, and seventh thicknesses $T1\_3$, $T1\_6$, and $T1\_7$ and the eight thickness $T1\_8$ may be the same or may be different. In other example embodiments, each of the second and fourth thicknesses $T1\_2$ and $T1\_4$ may be greater than each of the third, sixth, seventh, and eighth thicknesses $T1\_3$, $T1\_6$, $T1\_7$, and $T1\_8$.

For convenience, it is assumed that the second, third, fourth, sixth, seventh, and eighth thicknesses $T1\_2$, $T1\_3$, $T1\_4$, $T1\_6$, $T1\_7$, and $T1\_8$ are all the same before a process of adjusting the thicknesses of semiconductor chips.

A seven-level stacking process by which the eighth semiconductor chip 100_8 is added can further improve warpage, as compared to the six-level stacking process of FIG. 3A. In the six-level stacking process of FIG. 3A, if the second and fourth thicknesses $T1\_2$ and $T1\_4$ are increased by 4 μm, the thicknesses of the third, sixth, and seventh semiconductor chips 100_3, 100_6, and 100_7 need to be reduced by 8/3 μm.

In the seven-level stacking process of FIG. 4A, if the second and fourth thicknesses $T1\_2$ and $T1\_4$ are increased by 4 μm, the thicknesses of the third, sixth, seventh, and eighth semiconductor chips 100_3, 100_6, 100_7, and 100_8 are reduced by 2 μm, thereby further improving warpage.

For example, because the eighth semiconductor chip 100_8 with the eighth thickness $T1\_8$ is added, the second and fourth thicknesses $T1\_2$ and $T1\_4$ can be increased further than in the six-level stacking process of FIG. 3A. Thus, warpage can be mitigated or prevented on the edges of the space between first and second semiconductor chips 100_1 and 100_2, and any connection defects between the first and second semiconductor chips 100_1 and 100_2 can be improved.

Because the eighth semiconductor chip 100_8 with the eighth thickness $T1\_8$ is added, the second and fourth thicknesses $T1\_2$ and $T1\_4$ can be increased further than in the six-level stacking process of FIG. 3A. Thus, warpage can be mitigated or prevented in the center of the space between the fourth and fifth semiconductor chips 100_4 and 100_5, and any connection defects between the fourth and fifth semiconductor chips 100_4 and 100_5 can be improved.

In some example embodiments, an eighth gap filling part 90_8 may fill the gap between the fourth and eighth semiconductor chips 100_4 and 100_8. The eighth gap filling part 90_8 is illustrated as covering parts of the first and second side surfaces 100_4c and 100_4d of the fourth semiconductor chip 100_4 and parts of first and second side surfaces 100_8c and 100_8d of the eighth semiconductor chip 100_8, but the present disclosure is not limited thereto.

The eighth semiconductor chip 100_8 may include a plurality of eighth through vias 120_8. The eighth through vias 120_8 may have the same structure as first through vias 120_1, second through vias 120_2, third through vias 120_3, fourth through vias 120_4, fifth through vias 120_5, sixth through vias 120_6, and seventh through vias 120_7.

Eighth connecting terminals 140_8 may be disposed on a top surface 100_8a of the eighth semiconductor chip 100_8 that is opposite to a bottom surface 100_8b of the eighth semiconductor chip 100_8. The eighth connecting terminals 140_8 may electrically connect the fourth and eighth semiconductor chips 100_4 and 100_8 with each other.

Figure 4B:
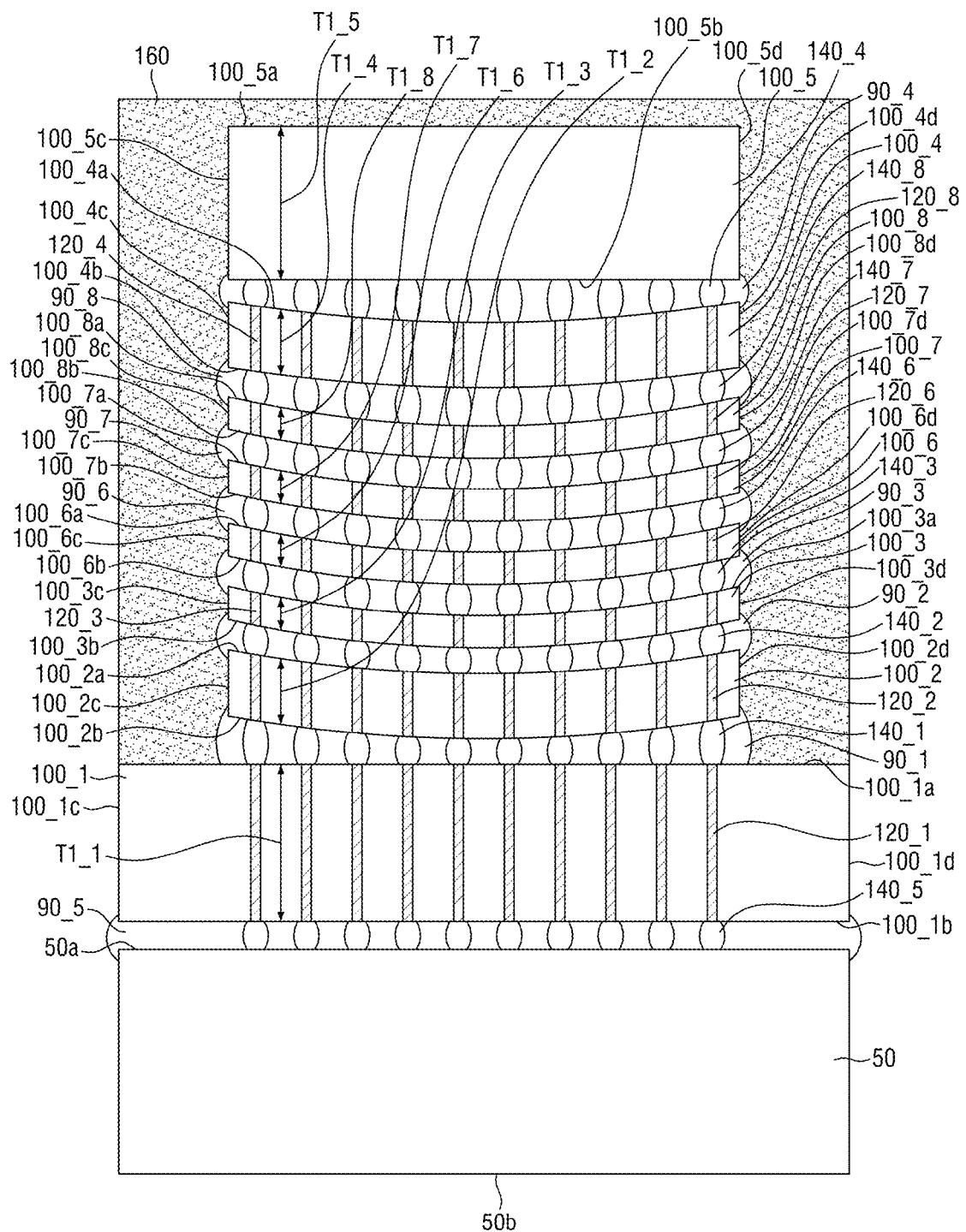
FIG. 4B is a cross-sectional view of a semiconductor package according to an example embodiment of the present disclosure.

FIG. 4B is a cross-sectional view of a semiconductor package according to an example embodiment of the present disclosure.

The semiconductor package of FIG. 4B will hereinafter be described, focusing mainly on the differences from the semiconductor package of FIG. 4A.

Referring to FIG. 4B, a package molding part 160 may cover not only the first and second side surfaces 100_5c and 100_5d of a fifth semiconductor chip 100_5, but also a top surface 100_5a of the fifth semiconductor chip 100_5. Because the package molding part 160 covers the top surface 100_5a of the fifth semiconductor chip 100_5, the package molding part 160 can protect the fifth semiconductor chip 100_5 from external physical shock or moisture applied to the top surface 100_5a of the fifth semiconductor chip 100_5.

Figure 5A:
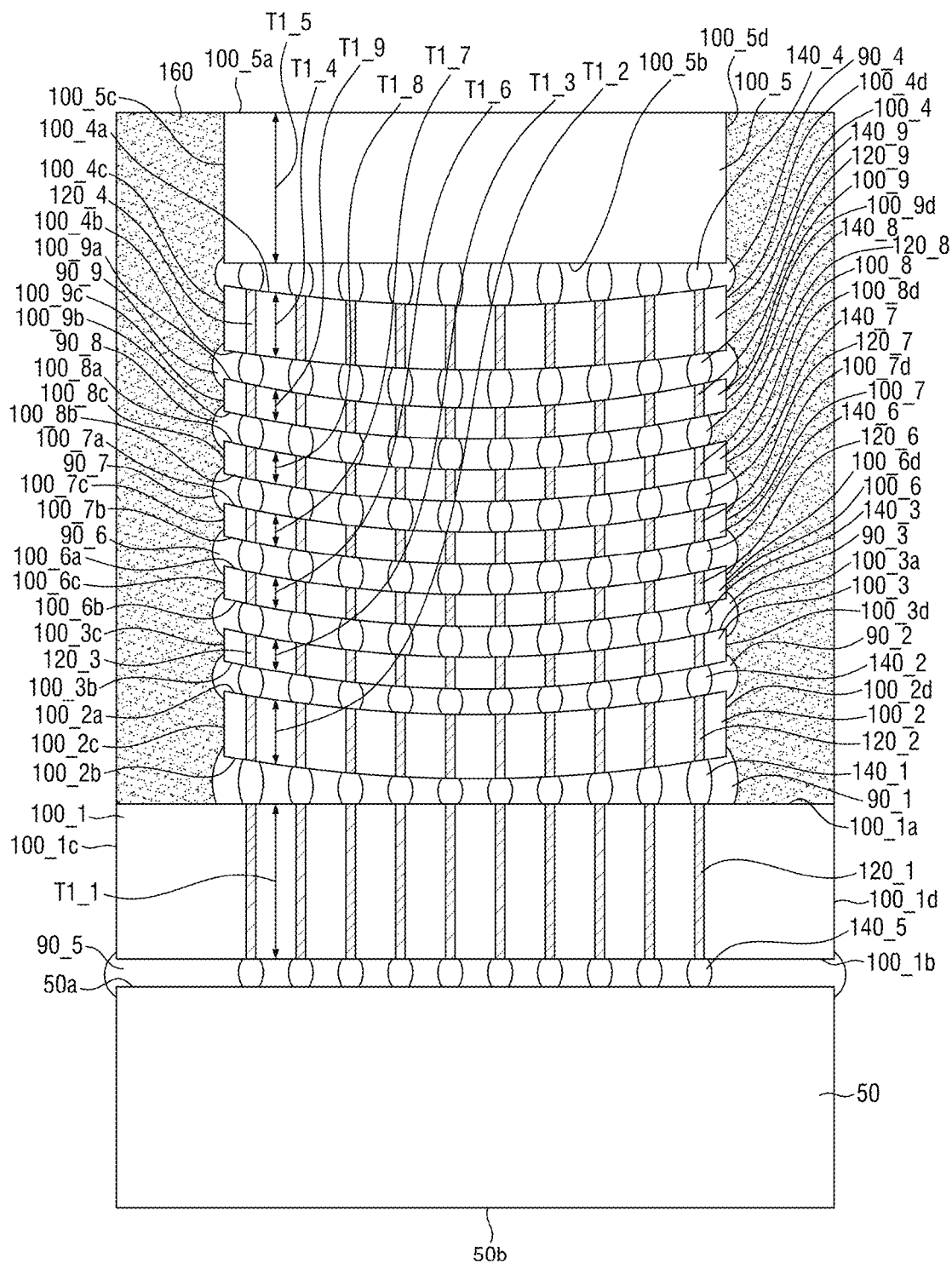
FIG. 5A is a cross-sectional view of a semiconductor package according to an example embodiment of the present disclosure.

FIG. 5A is a cross-sectional view of a semiconductor package according to an example embodiment of the present disclosure.

The semiconductor package of FIG. 5A will hereinafter be described, focusing mainly on the differences from the semiconductor package of FIG. 4A.

Referring to FIG. 5A, a ninth semiconductor chip 100_9 having a ninth thickness T1_9 may be disposed between fourth and eighth semiconductor chips 100_4 and 100_8.

The ninth thickness T1_9 may refer to the height from a bottom surface 100_9b to a top surface 100_9a of the ninth semiconductor chip 100_9.

In some example embodiments, third, sixth, seventh, and eighth thicknesses T1_3, T1_6, T1_7, and T1_8 and the ninth thickness T1_9 may be the same or may be different. In some example embodiments, each of the second and fourth thicknesses T1_2 and T1_4 may be greater than each of the third, sixth, seventh, eighth, and ninth thicknesses T1_3, T1_6, T1_7, T1_8, and T1_9.

For convenience, it is assumed that the second, third, fourth, sixth, seventh, eighth, and ninth thicknesses T1_2, T1_3, T1_4, T1_6, T1_7, T1_8, and T1_9 are all the same before a process of adjusting the thicknesses of semiconductor chips.

An eight-level stacking process by which the ninth semiconductor chip 100_9 is added can further improve warpage, as compared to the seven-level stacking process of FIG. 4A. In the seven-level stacking process of FIG. 4A, if the second and fourth thicknesses T1_2 and T1_4 are increased by 4 μm, the thicknesses of the third, sixth, seventh, and eighth semiconductor chips 100_3, 100_6, 100_7, and 100_8 need to be reduced by 2 μm.

In the eight-level stacking process of FIG. 5A, if the second and fourth thicknesses T1_2 and T1_4 are increased by 4 μm, the thicknesses of the third, sixth, seventh, eighth, and ninth semiconductor chips 100_3, 100_6, 100_7, 100_8, and 100_9 are reduced by 1.6 μm, thereby further improving warpage.

For example, because the ninth semiconductor chip 100_9 with the ninth thickness T1_9 is added, the second and fourth thicknesses T1_2 and T1_4 can be increased further than in the seven-level stacking process of FIG. 4A. Thus, warpage can be mitigated or prevented on the edges of the space between first and second semiconductor chips 100_1 and 100_2, and any connection defects between the first and second semiconductor chips 100_1 and 100_2 can be improved.

Because the ninth semiconductor chip 100_9 with the ninth thickness T1_9 is added, the second and fourth thicknesses T1_2 and T1_4 can be increased further than in the seven-level stacking process of FIG. 4A. Thus, warpage can be mitigated or prevented in the center of the space between the fourth and fifth semiconductor chips 100_4 and 100_5, and any connection defects between the fourth and fifth semiconductor chips 100_4 and 100_5 can be improved.

In some example embodiments, a ninth gap filling part 90_9 may fill the gap between the fourth and ninth semiconductor chips 100_4 and 100_9. The ninth gap filling part 90_9 is illustrated as covering parts of the first and second side surfaces 100_4c and 100_4d of the fourth semiconductor chip 100_4 and parts of first and second side surfaces 100_9c and 100_9d of the ninth semiconductor chip 100_9, but the present disclosure is not limited thereto.

The ninth semiconductor chip 100_9 may include a plurality of ninth through vias 120_9. The ninth through vias 120_9 may have the same structure as first through vias 120_1, second through vias 120_2, third through vias 120_3, fourth through vias 120_4, fifth through vias 120_5, sixth through vias 120_6, seventh through vias 120_7, and eighth through vias 120_8.

Ninth connecting terminals 140_9 may be disposed on a top surface 100_9a of the ninth semiconductor chip 100_9 that is opposite to a bottom surface 100_9b of the ninth semiconductor chip 100_9. The ninth connecting terminals 140_9 may electrically connect the fourth and ninth semiconductor chips 100_4 and 100_9 with each other.

Figure 5B:
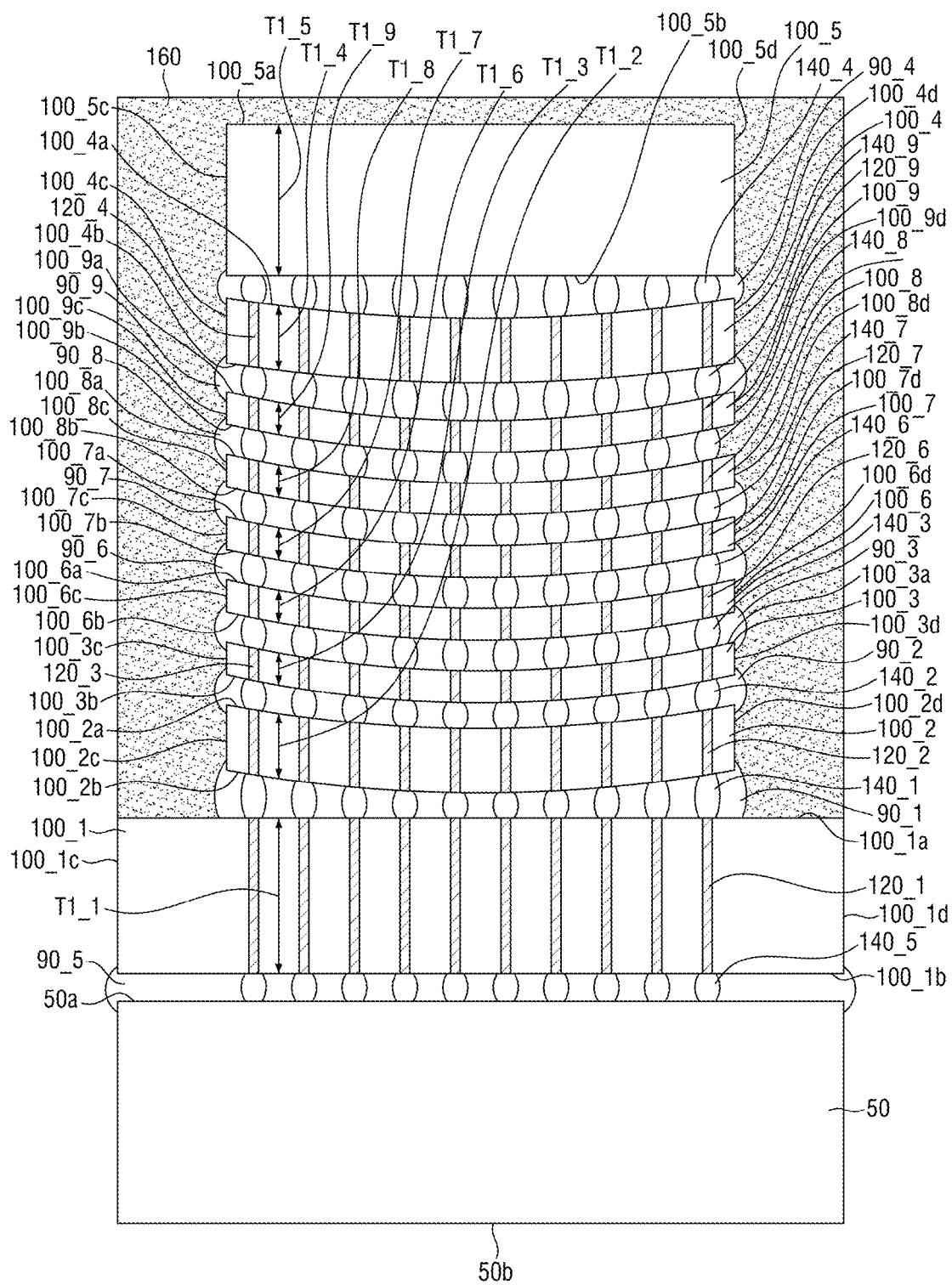
FIG. 5B is a cross-sectional view of a semiconductor package according to an example embodiment of the present disclosure.

FIG. 5B is a cross-sectional view of a semiconductor package according to an example embodiment of the present disclosure.

The semiconductor package of FIG. 5B will hereinafter be described, focusing mainly on the differences from the semiconductor package of FIG. 5A.

Referring to FIG. 5B, a package molding part 160 may cover not only the first and second side surfaces 100_5c and 100_5d of a fifth semiconductor chip 100_5, but also a top surface 100_5a of the fifth semiconductor chip 100_5. Because the package molding part 160 covers the top surface 100_5a of the fifth semiconductor chip 100_5, the package molding part 160 can protect the fifth semiconductor chip 100_5 from external physical shock or moisture applied to the top surface 100_5a of the fifth semiconductor chip 100_5.

In concluding the detailed description, those skilled in the art will appreciate that many variations and modifications may be made to the disclosed example embodiments without substantially departing from the principles of the present inventive concepts. Therefore, the disclosed example embodiments of the present inventive concepts are used in a generic and descriptive sense only and not for purposes of limitation.

What is claimed is:

1. A semiconductor package comprising:
a first semiconductor chip having a first thickness;
a second semiconductor chip on the first semiconductor chip and having a second thickness, the second thickness being smaller than the first thickness;
a third semiconductor chip on the second semiconductor chip and having a third thickness, the third thickness being smaller than the second thickness;
a fourth semiconductor chip on the third semiconductor chip and having a fourth thickness, the fourth thickness being greater than the third thickness; and
a fifth semiconductor chip disposed on the fourth semiconductor chip and having a fifth thickness, the fifth thickness being greater than the fourth thickness.

2. The semiconductor package of claim 1, further comprising:
a sixth semiconductor chip between the third and fourth semiconductor chips and having a sixth thickness, the sixth thickness being smaller than the fourth thickness.

3. The semiconductor package of claim 2, wherein the sixth thickness is smaller than the second thickness.

4. The semiconductor package of claim 2, wherein the sixth thickness is the same as the third thickness.

5. The semiconductor package of claim 2, wherein each of the first through fourth and sixth semiconductor chips includes a plurality of through vias.

6. The semiconductor package of claim 1, wherein the fifth thickness is greater than the second thickness.

7. The semiconductor package of claim 1, further comprising:
a package molding part on the first semiconductor chip, the package molding part surrounding the second through fifth semiconductor chips.

8. The semiconductor package of claim 7, wherein the package molding part exposes a top surface of the fifth semiconductor chip.

9. The semiconductor package of claim 1, wherein the first and fifth thicknesses are the same.

10. A semiconductor package comprising:
a first semiconductor chip and a second semiconductor chip spaced apart from each other;
a third semiconductor chip between the first and second semiconductor chips, the third semiconductor chip being directly on the first semiconductor chip;
a fourth semiconductor chip between the first and second semiconductor chips, the fourth semiconductor chip being directly below the second semiconductor chip, the fourth semiconductor chip having the same thickness as the third semiconductor chip;
a fifth semiconductor chip between the third and fourth semiconductor chips, the fifth semiconductor chip having a smaller thickness than the third semiconductor chip; and
a package molding part on the first semiconductor chip, the package molding part including a first portion that surrounds side surfaces of the second through fifth semiconductor chips and exposes a top surface of the second semiconductor chip.

11. The semiconductor package of claim 10, further comprising:
a sixth semiconductor chip between the fourth and fifth semiconductor chips, the sixth semiconductor chip having a thickness smaller than the third semiconductor chip.

12. The semiconductor package of claim 11, wherein the sixth semiconductor chip has the same thickness as the fifth semiconductor chip.

13. The semiconductor package of claim 11, wherein the sixth semiconductor chip has a different thickness from the fifth semiconductor chip.

14. The semiconductor package of claim 10, wherein the second semiconductor chip does not include through vias.

15. The semiconductor package of claim 10, wherein the package molding part further includes a second portion that covers the a top surface of the second semiconductor chip.

16. A semiconductor package comprising:
a first semiconductor chip having a first thickness and including first through vias;
a second semiconductor chip directly on the first semiconductor chip, the second semiconductor chip having a second thickness and including second through vias, the second thickness being smaller than the first thickness;
a third semiconductor chip on the second semiconductor chip, the third semiconductor chip having a third thickness and including third through vias, the third thickness being smaller than the second thickness;
a fourth semiconductor chip on the third semiconductor chip, the fourth semiconductor chip having the second thickness and including fourth through vias;
a fifth semiconductor chip directly on the fourth semiconductor chip, the fifth semiconductor chip having a fourth thickness and not including through vias, the fourth thickness being greater than the second thickness; and
a package molding part on the first semiconductor chip and exposing a top surface of the fifth semiconductor chip.

17. The semiconductor package of claim 16, further comprising:
a mounting substrate below the first semiconductor chip.

18. The semiconductor package of claim 17, further comprising:
connecting terminals electrically connecting the mounting substrate and the first through fifth semiconductor chips.

19. The semiconductor package of claim 16, wherein the first and fourth thicknesses are the same.

20. The semiconductor package of claim 16, wherein the first and fourth thicknesses are different.

* * * * *